(12) United States Patent
Balasundaram et al.

(10) Patent No.: US 10,432,150 B2
(45) Date of Patent: Oct. 1, 2019

(54) REDUCING AUDIO ARTIFACTS IN AN AMPLIFIER DURING CHANGES IN POWER STATES

(71) Applicant: Cirrus Logic International Semiconductor Ltd., Edinburgh (GB)

(72) Inventors: Ramya Balasundaram, Austin, TX (US); Bhupendra Manola, Austin, TX (US); Pradeep Dhananjay, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/993,955

(22) Filed: May 31, 2018

(65) Prior Publication Data

US 2018/0358934 A1  Dec. 13, 2018

Related U.S. Application Data

(60) Provisional application No. 62/518,913, filed on Jun. 13, 2017.

(51) Int. Cl.
*H03F 1/30* (2006.01)
*H03F 3/45* (2006.01)
(Continued)

(52) U.S. Cl.
CPC ............ *H03F 1/305* (2013.01); *G06F 3/165* (2013.01); *H03F 1/52* (2013.01); *H03F 3/187* (2013.01); *H03F 3/45071* (2013.01); *H03F 3/45475* (2013.01); *H03F 2200/03* (2013.01); *H03F 2200/129* (2013.01); *H03F 2200/321* (2013.01); *H03F 2200/387* (2013.01);
(Continued)

(58) Field of Classification Search
CPC . H03F 1/30; H03F 3/187; H03F 3/217; H03F 1/52; G06F 3/16; H03G 3/3089; H04M 3/376; H04M 3/502; H04R 3/09; H04R 1/1016
USPC ........ 700/94; 381/94.5, 94.1, 94.6; 330/296, 330/251, 51
See application file for complete search history.

(56) References Cited

U.S. PATENT DOCUMENTS 7,999,712 B2 *  8/2011  Chiang ................ H03G 3/3089
                                                        341/139
8,315,408 B2 *  11/2012  Judge ..................... H03G 3/348
                                                        381/120
(Continued)

*Primary Examiner* — Melur Ramakrishnaiah
(74) *Attorney, Agent, or Firm* — Jackson Walker L.L.P.

(57) ABSTRACT

An apparatus may include a digital-to-analog converter configured to convert a digital audio input signal into a differential analog input signal with a substantially non-zero common-mode voltage, an amplifier configured to receive the differential analog input signal and generate at an amplifier output a ground-centered output signal from the differential analog input signal, a clamp configured to selectively couple and decouple the amplifier output to a ground voltage, and a controller configured to control the clamp to selectively couple and decouple the amplifier output to a ground voltage responsive to transitions between power states of a device comprising the apparatus and control the differential analog input signal generated by the digital-to-analog converter in order to minimize a level transition current through an output load coupled to the amplifier output during transitions between the power states.

20 Claims, 4 Drawing Sheets

(51) Int. Cl.
  *H03F 3/187* (2006.01)
  *H03F 1/52* (2006.01)
  *G06F 3/16* (2006.01)

(52) U.S. Cl.
  CPC ............. *H03F 2203/45151* (2013.01); *H03F 2203/45528* (2013.01); *H03F 2203/45636* (2013.01)

(56) References Cited

U.S. PATENT DOCUMENTS 9,014,396 B2 * 4/2015 Miao ...................... H03F 1/305
  330/284
2003/0185409 A1 * 10/2003 Shimotoyodome ..... H03F 1/305
  381/94.1

* cited by examiner

REDUCING AUDIO ARTIFACTS IN AN AMPLIFIER DURING CHANGES IN POWER STATES

RELATED APPLICATION

The present disclosure claims priority to U.S. Provisional Patent Application Ser. No. 62/518,913, filed Jun. 13, 2017, which is incorporated by reference herein in its entirety.

FIELD OF DISCLOSURE

The present disclosure relates in general to circuits for audio devices, including without limitation personal audio devices, such as wireless telephones and media players, and more specifically, to systems and methods relating to reducing audio artifacts in an amplifier during powering on and powering off the amplifier and related components.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

Many personal audio devices experience transient electrical effects during powering on and powering off or transitioning to and from low power states that can lead to audibly-detectable artifacts occurring at a transducer (e.g., a loudspeaker, a headphone) of the personal audio device. To ensure positive customer experience, it may be desirable to minimize or eliminate such audio artifacts.

SUMMARY

In accordance with the teachings of the present disclosure, one or more disadvantages and problems associated with existing approaches to powering on and powering off components in an audio system may be reduced or eliminated.

In accordance with embodiments of the present disclosure, an apparatus may include a digital-to-analog converter configured to convert a digital audio input signal into a differential analog input signal with a substantially non-zero common-mode voltage, an amplifier configured to receive the differential analog input signal and generate at an amplifier output a ground-centered output signal from the differential analog input signal, a clamp configured to selectively couple and decouple the amplifier output to a ground voltage, and a controller configured to control the clamp to selectively couple and decouple the amplifier output to a ground voltage responsive to transitions between power states of a device comprising the apparatus and control the differential analog input signal generated by the digital-to-analog converter in order to minimize a level transition current through an output load coupled to the amplifier output during transitions between the power states.

In accordance with these and other embodiments of the present disclosure, a method may include, in an apparatus comprising a digital-to-analog converter configured to convert a digital audio input signal into a differential analog input signal with a substantially non-zero common-mode voltage, an amplifier configured to receive the differential analog input signal and generate at an amplifier output a ground-centered output signal from the differential analog input signal, and a clamp configured to selectively couple and decouple the amplifier output to a ground voltage, controlling the clamp to selectively couple and decouple the amplifier output to a ground voltage responsive to transitions between power states of a device comprising the apparatus and controlling the differential analog input signal generated by the digital-to-analog converter in order to minimize a level transition current through an output load coupled to the amplifier output during transitions between the power states.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
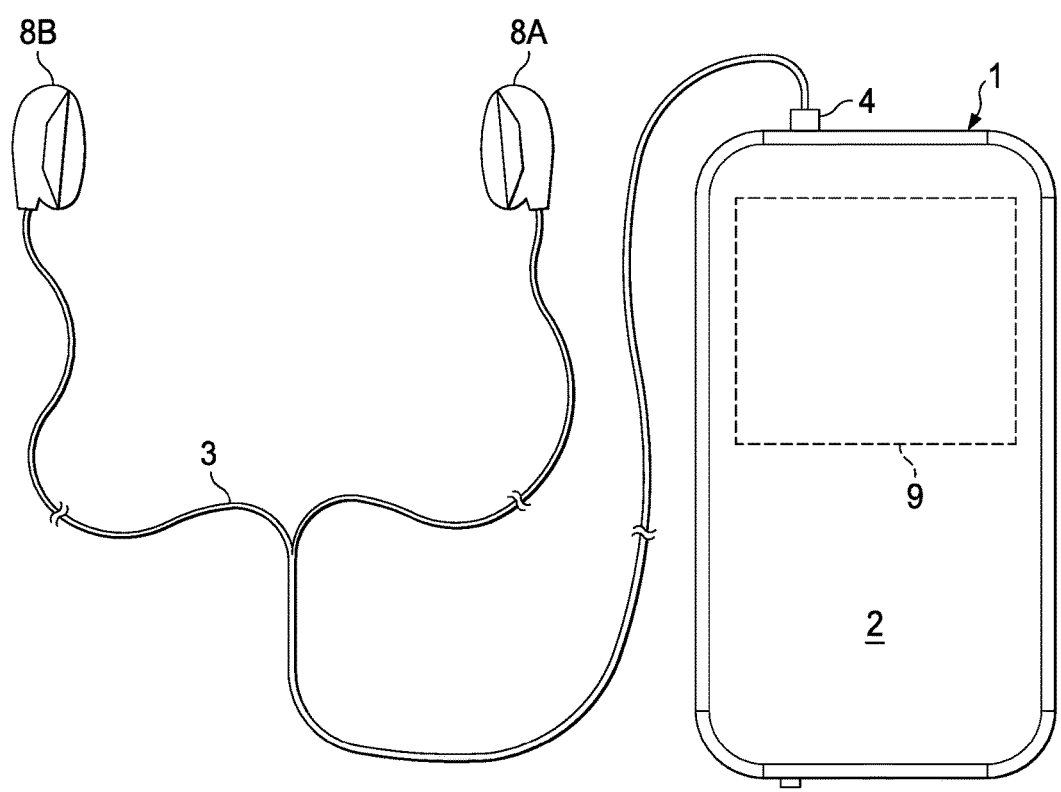
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
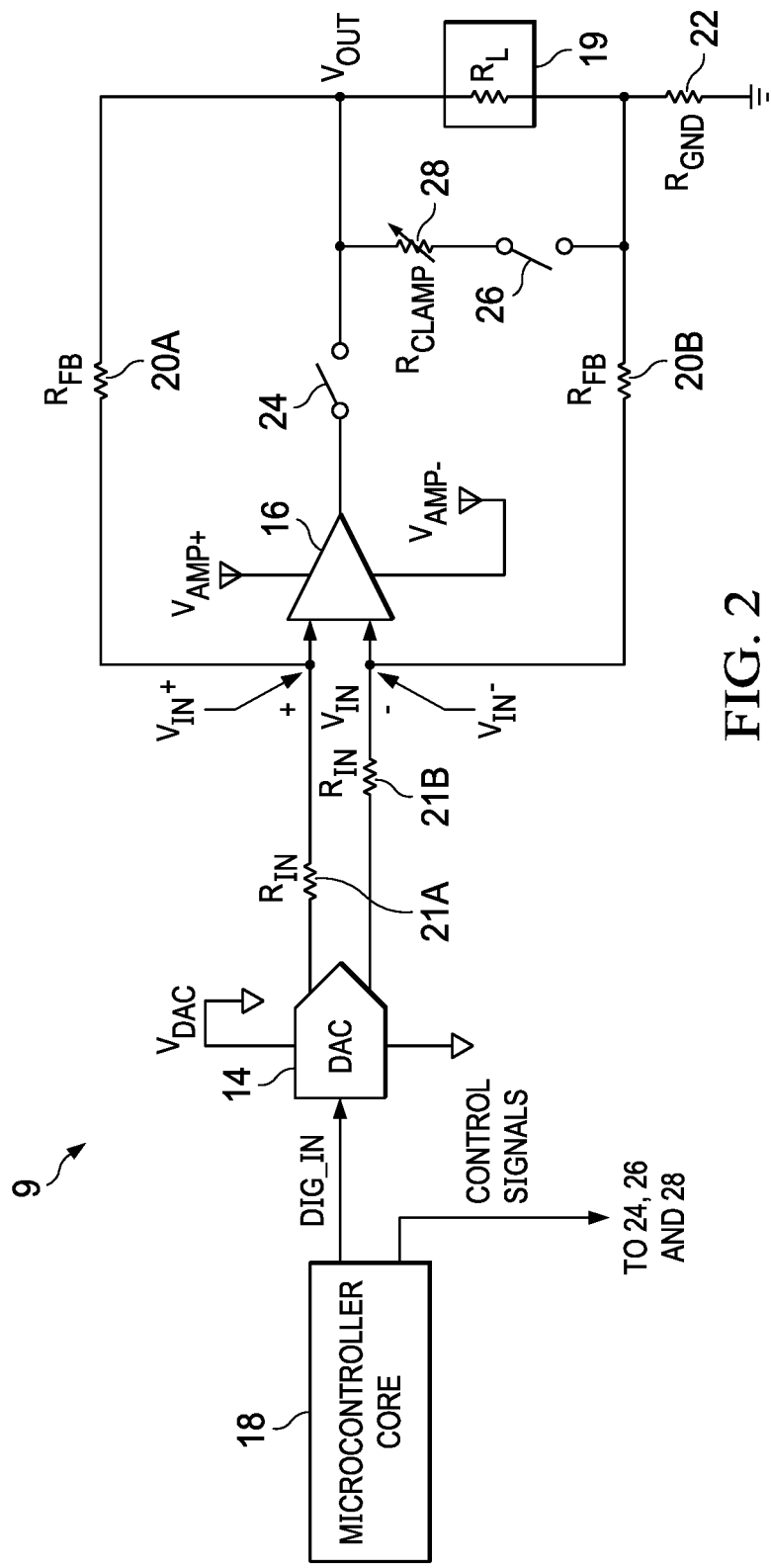
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog input signal $V_{IN}$, wherein analog input signal $V_{IN}$ equals the difference between a voltage $V_{IN}^+$ and a voltage $V_{IN}^-$. As shown in FIG. 2, DAC 14 may be supplied with electrical energy from a voltage source with a first terminal having a supply voltage $V_{DAC}$ relative to a ground voltage and a second terminal at the ground voltage. Accordingly, analog input signal $V_{IN}$ generated by DAC 14 may be non-ground centered such that analog input signal $V_{IN}$ has a substantially non-zero common mode voltage (e.g., $V_{DAC}/2$) relative to the ground voltage.

DAC 14 may supply analog signal $V_{IN}$ to an amplifier 16 which may amplify or attenuate analog input signal $V_{IN}$ to provide an audio output signal $V_{OUT}$, which may operate a load 19, wherein such load may comprise a speaker, headphone transducer (e.g., earbud speaker 8A or 8B), a line level signal output, and/or other suitable output. As depicted in FIG. 2, input resistors 21A and 21B each having resistance $R_{IN}$ may be coupled between respective outputs of DAC 14 and respective inputs of amplifier 16.

As shown in FIG. 2, amplifier 16 may be supplied with electrical energy from a voltage source with a first terminal having a supply voltage $V_{AMP}^+$ relative to the ground voltage and a second terminal at a supply voltage $V_{AMP}^-$ relative to the ground voltage which is equal in magnitude to but of opposite polarity of supply voltage $V_{AMP}^+$. Accordingly, output signal $V_{OUT}$ generated by amplifier 16 may be ground centered such that output signal $V_{IN}$ has a substantially zero common mode voltage relative to the ground voltage. Thus, amplifier 16 may include a differential input for receiving a non-ground-centered input voltage (e.g., analog input voltage $V_{IN}$) and generating therefrom a ground-centered single-ended output signal (e.g., output voltage $V_{OUT}$) at its output.

As shown in FIG. 2, load 19 is modeled as a resistor with resistance $R_L$. However, in some embodiments, load 19 may have a complex impedance including capacitive and/or inductive elements in lieu of or in addition to resistance $R_L$. Also as shown in FIG. 2, load 19 may be coupled at a first terminal (e.g., via output switch 24) to the output of amplifier 16 and may be coupled at a second terminal (e.g., via ground resistor 22 having resistance $R_{GND}$) to the ground voltage. Ground resistor 22 may be selected to have a small enough resistance $R_{GND}$ relative to resistance $R_L$ of load 19 that during steady state operation of audio IC 9, the voltage across ground resistor 22 is approximately zero, and the voltage across load 19 is approximately output voltage $V_{OUT}$.

Also as shown in FIG. 2, audio IC 9 may also include an amplifier feedback network comprising feedback resistors 20A and 20B each having resistance $R_{FB}$, wherein feedback resistor 20A may be coupled at a first terminal (e.g., via output switch 24) to the output of amplifier 16 and may be coupled at a second terminal to a first differential input of amplifier 16, and feedback resistor 20B may be coupled at a first terminal (e.g., via output switch 24) to an electrical node common to load 19 and ground resistor 22, and may be coupled at a second terminal to a second differential input of amplifier 16. The ratio of the resistance $R_{FB}$ to the resistance $R_{IN}$ may establish a signal gain for amplifier 16.

Further as shown in FIG. 2, audio IC 9 may include an output switch 24. Output switch 24 may include any suitable system, device, or apparatus (e.g., a transistor) configured to, when enabled (e.g., activated, closed, turned on), electrically couple amplifier 16 to load 19 and when disabled (e.g., deactivated, open, turned off), electrically decouple amplifier 16 from load 19.

Moreover, as shown in FIG. 2, audio IC 9 may include a clamping switch 26 and a variable clamping resistor 28 that form a clamping network. Clamping switch 26 may include any suitable system, device, or apparatus (e.g., a transistor) configured to, when enabled (e.g., activated, closed, turned on), close an electrical path such that clamping resistor 28 is coupled between a first terminal of load 19 and a second terminal of load 19, and when disabled (e.g., deactivated, open, turned off), open the electrical path by decoupling clamping resistor 28 from a terminal of load 19. Those of skill in the art will recognize that the relative positions of clamping switch 26 and clamping resistor 28 may be switched and remain functionally equivalent.

Clamping resistor 28 may comprise any suitable system, device, or apparatus having a controllable impedance (e.g., variable resistance $R_{CLAMP}$). Thus, as described in more detail below, when clamping switch 26 is enabled and output switch 24 is disabled, the impedance of clamping resistor 28 may be varied to control output voltage $V_{OUT}$ (e.g., increase impedance of clamping resistor 28 to increase output voltage $V_{OUT}$ and decrease impedance of clamping resistor 28 to decrease output voltage $V_{OUT}$). As is described in more detail below, the impedance of clamping resistor 28 may be varied to control output voltage $V_{OUT}$ during a powering on and/or powering off sequence of personal audio device 1 in order to minimize or eliminate the occurrence of audio artifacts during powering on and/or powering off.

As shown in FIG. 2, microcontroller core 18 may also generate control signals for controlling operation of output switch 24, clamping switch 26, clamping resistor 28, and other components of audio IC 9 to reduce or eliminate audio artifacts during powering on and powering off personal audio device 1 while still ensuring appropriate steady-state operation of audio IC 9. Functionality of microcontroller 18 may be illustrated with reference to FIGS. 3 and 4 and the description thereof, below.

Figure 3:
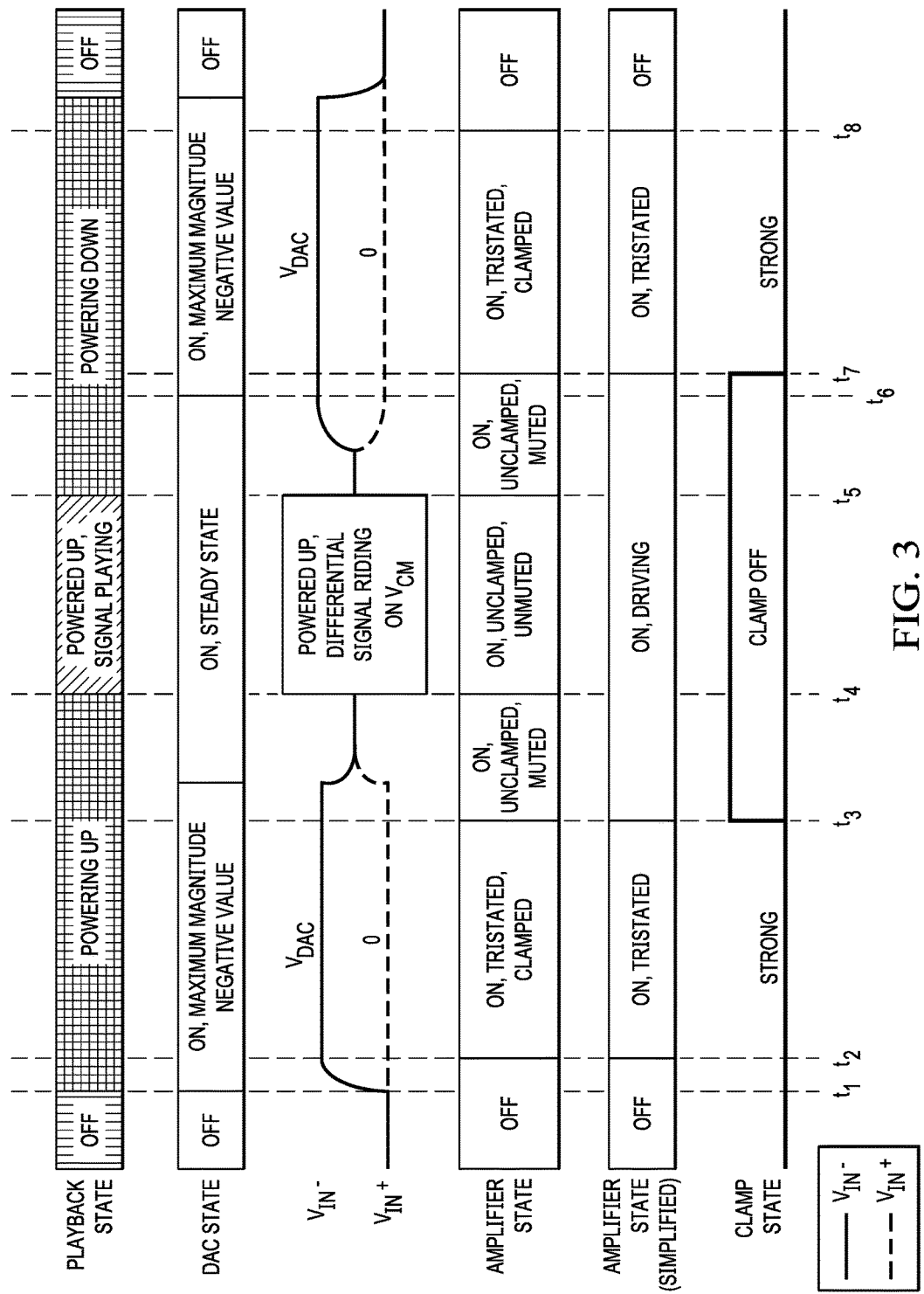
FIG. 3 is an example timing diagram depicting operation of various components of an audio integrated circuit of a personal audio device during powering on, steady state operation, and powering off the personal audio device, in accordance with embodiments of the present disclosure.

FIG. 3 is an example timing diagram depicting operation of various components of audio IC 9 of a personal audio device 1 during powering on, steady state operation, and powering off personal audio device 1, in accordance with embodiments of the present disclosure.

At a time labeled $t_1$ in FIG. 3, personal audio device 1 may be powered on (e.g., responsive to a user interacting with a power button or other user interface device for powering on personal audio device 1). Responsive to being powered on, personal audio device 1 may enter a powering up playback state, as shown in FIG. 3. At or near the beginning of such powering up playback state, microcontroller core 18 may force digital audio input signal DIG_IN to its maximum magnitude negative value, such that the analog input signal $V_{IN}$ is driven to its maximum magnitude negative value (e.g., $V_{IN}=-V_{DAC}$ as shown in FIG. 3). Also at or near the beginning of the powering up playback state (e.g., shown at time $t_2$ in FIG. 3), microcontroller core 18 may generate control signals (e.g., shown as "CONTROL SIGNALS" in FIG. 3) such that load 19 of audio IC 9 operates in a tristated, clamped amplifier state, meaning that microcontroller core 18 may cause output switch 24 to be deactivated, thus "tristating" the output of amplifier 16 by decoupling load 19 from the output of amplifier 16, and cause clamping switch 26 to be activated, thus clamping one terminal of load 19 to its other terminal via clamping resistor 28. Also as shown in FIG. 3, during the beginning of the powering up playback state, clamping resistor 28 may be placed in a strong clamp state, meaning that microcontroller core 18 may control the impedance of clamping resistor 28 to have an approximately zero value, such that the two terminals of load 19 are at approximately the same electric potential and output voltage $V_{OUT} \approx 0$.

At a later time within the powering up playback state (e.g., shown at time $t_3$ in FIG. 3), microcontroller core 18 may generate control signals such that amplifier 16 of audio IC 9 operates in an unclamped amplifier state, meaning that microcontroller core 18 may cause output switch 24 to be activated, thus coupling a first terminal of load 19 to the output of amplifier 16 and decoupling the first terminal of load 19 from the second terminal of load 19. Accordingly, given that analog input signal $V_{IN}$ remains forced to its maximum magnitude negative value, amplifier 16 may generate an output voltage $V_{OUT}$ of approximately zero, thus muting load 19. As a result, an amplifier state of amplifier 16 may be unclamped and muted and the clamp state of clamping switch 26 and clamping resistor 28 may be an off clamp state.

After unclamping and muting the output of amplifier 16 during the powering on playback state, microcontroller core 18 may generate a digital audio input signal DIG_IN in order to cause analog input signal $V_{IN}$ to ramp to its zero value (e.g., ramp both input terminals of amplifier 16 to the non-zero common-mode voltage of analog input signal $V_{IN}$), thus maintaining muting of load 19.

At a later time (e.g., shown at time $t_4$ in FIG. 3), personal audio device 1 may transition from the powering up playback state to the powered up playback state, unmuting load 19 and playing back actual audio in the signal path from digital audio input signal DIG_IN through output voltage $V_{OUT}$, thus operating in steady state.

At yet a later time (e.g., labeled $t_5$ in FIG. 3), personal audio device 1 may receive a command to power down (e.g., responsive to a user interacting with a power button or other user interface device for powering off personal audio device 1). Responsive to a command to power down, personal audio device 1 may enter a powering down playback state. At or near the beginning of the powering down playback state, microcontroller core 18 may generate a digital audio input signal DIG_IN in order to cause analog input signal $V_{IN}$ to its zero value (e.g., cause both input terminals of amplifier 16 to be at the non-zero common-mode voltage of analog input signal $V_{IN}$), such that the output of amplifier 16 of audio IC 9 operates in a muted, unclamped amplifier state.

During the muted, unclamped amplifier state of amplifier 16, microcontroller core 18 may ramp digital audio input signal DIG_IN to its maximum magnitude negative value, such that the analog input signal $V_{IN}$ is ramped to its maximum magnitude negative value by a time labeled $t_6$ in FIG. 3. After microcontroller core 18 ramps analog input signal $V_{IN}$ to its maximum magnitude negative value, microcontroller core 18 may (e.g., at a time labeled $t_7$ in FIG. 3) generate control signals such that the output of amplifier 16 of audio IC 9 operates in a tristated, clamped amplifier state, wherein microcontroller core 18 may cause output switch 24 to be deactivated, thus "tristating" the output by decoupling load 19 from the output of amplifier 16, and cause clamping switch 26 to be activated, thus clamping one terminal of load 19 to its other terminal via clamping resistor 28. At such time, clamping resistor 28 may be placed in a strong clamp state, meaning that microcontroller core 18 may control the impedance of clamping resistor 28 to have an approximately zero value, such that the two terminals of load 19 are at approximately the same electric potential and output voltage $V_{OUT} \approx 0$. Subsequently (e.g., at a time labeled $t_8$ in FIG. 3 and thereafter), various components of audio IC 9 may completely power off.

The controlling of the signal path and switches as described above may reduce or eliminate audible audio artifacts from occurring during transitioning between states in which personal audio device 1 is powered on and powered off. For example, the varying of analog input signal $V_{IN}$ generated by DAC 14 during transition between power states may minimize a level transition current that may flow through load 19 during such transitions, and clamping of load 19 may also further suppress transient signals on load 19 and potential audio artifacts that may be created from such transient signals.

Figure 4:
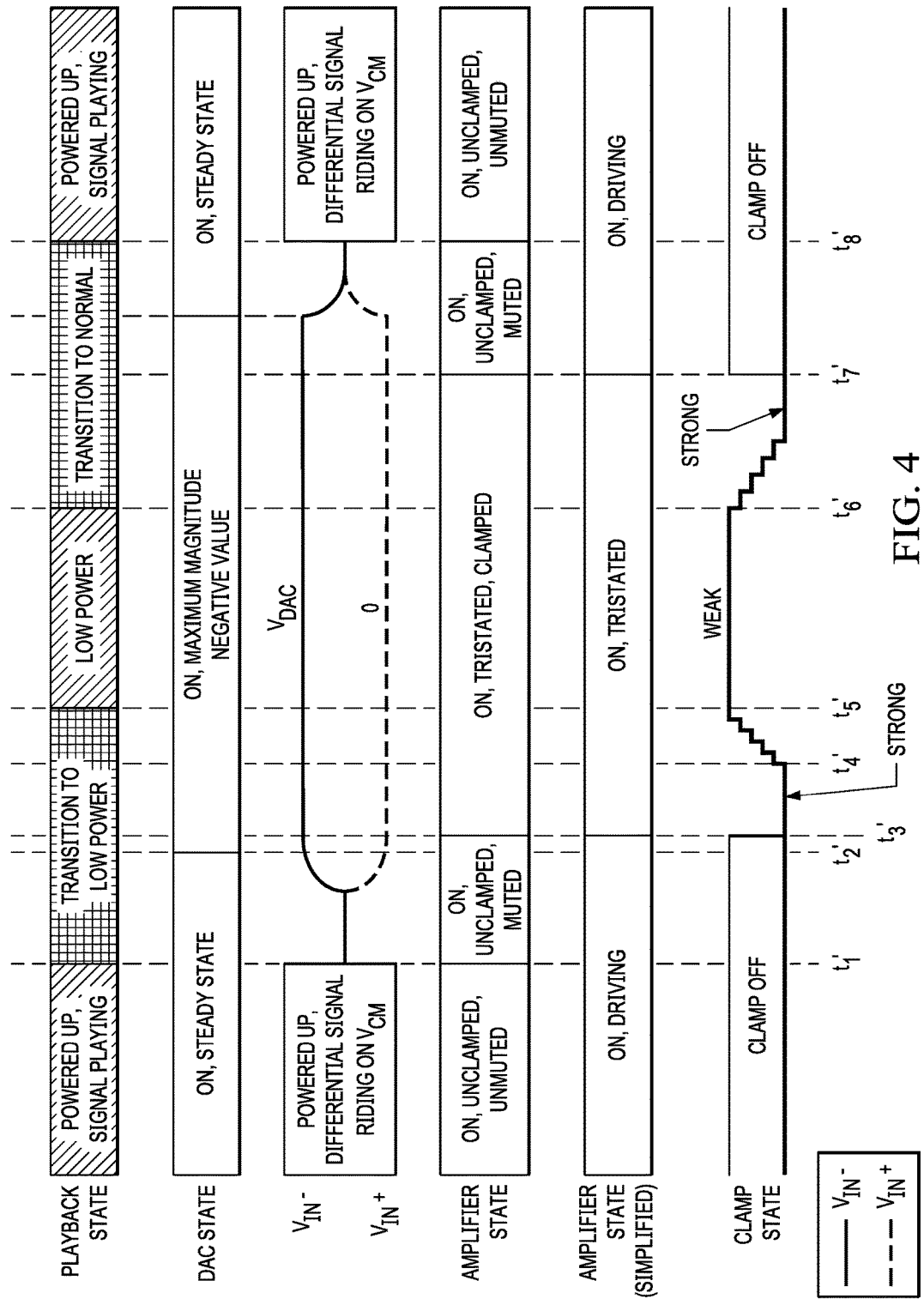
FIG. 4 is an example timing diagram depicting operation of various components of an audio integrated circuit of a personal audio device during transitioning to and from a low power state of the personal audio device, in accordance with embodiments of the present disclosure.

FIG. 4 is an example timing diagram depicting operation of various components of audio IC 9 of personal audio device 1 during transitioning to and from a low power state of personal audio device 1, in accordance with embodiments of the present disclosure.

At a time labeled $t_1'$ in FIG. 4, personal audio device 1 may begin to transition to a low power playback state from a powered up playback state in response to an appropriate trigger for entering the low power state (e.g., responsive to a user interacting with a power button or other user interface device, personal audio device 1 entering a sleep mode due to user inactivity, etc.). Responsive to such trigger, personal audio device 1 may enter a transition to low power playback state at time $t_1'$, as shown in FIG. 4.

At or near the beginning of the transition to low power playback state, microcontroller core 18 may generate a digital audio input signal DIG_IN in order to cause analog input signal $V_{IN}$ to its zero value (e.g., cause both input terminals of amplifier 16 to be at the non-zero common-mode voltage of analog input signal $V_{IN}$), such that amplifier 16 of audio IC 9 operates in a muted, unclamped amplifier state.

During the muted, unclamped amplifier state of amplifier 16, microcontroller core 18 may ramp digital audio input signal DIG_IN to its maximum magnitude negative value, such that the analog input signal $V_{IN}$ is ramped to its maximum magnitude negative value by a time labeled $t_2'$ in FIG. 4. After microcontroller core 18 ramps analog input signal $V_{IN}$ to its maximum magnitude negative value, microcontroller core 18 may (e.g., at a time labeled $t_3'$ in FIG. 3) generate control signals such that the output of amplifier 16 of audio IC 9 operates in a tristated, clamped amplifier state, wherein microcontroller core 18 may cause output switch 24 to be deactivated, thus "tristating" the output of amplifier 16 by decoupling load 19 from the output of amplifier 16, and cause clamping switch 26 to be activated, thus clamping one terminal of load 19 to its other terminal via clamping resistor 28. At such time, clamping resistor 28 may be placed in a strong clamp state, meaning that microcontroller core 18 may control the impedance of clamping resistor 28 to have an approximately zero value, such that the two terminals of load 19 are at approximately the same electric potential and output voltage $V_{OUT} \approx 0$.

After the output of amplifier 16 has been tristated and clamped, during the transition to low power playback state (e.g., at a time labeled $t_4'$ in FIG. 4), microcontroller core 18 may control clamping resistor 28 to transition in steps (as shown in FIG. 4) or continuously from the strong clamp state to the weak clamp state by increasing an impedance of clamping resistor 28 during such transition. After clamping resistor 28 has reached its weak state (e.g., at a time labeled $t_5'$ in FIG. 4), personal audio device 1 may enter a lower power playback state. During the low power playback state, microcontroller core 18 may maintain digital audio input signal DIG_IN at its maximum magnitude negative level (thus maintaining analog input signal $V_{IN}$ at its maximum magnitude negative level), maintain the output of amplifier 16 in a tristated, clamped amplifier state, and maintain clamping resistor 28 in a weak clamp state.

At a time labeled $t_6'$ in FIG. 4, personal audio device 1 may begin to transition from a low power playback state to a powered up playback state in response to an appropriate trigger for exiting the low power state (e.g., responsive to a user interacting with a power button or other user interface device, personal audio device 1 exiting a sleep mode due to user activity, etc.). Responsive to such trigger, personal audio device 1 may enter a transition to normal playback state at time $t_6'$, as shown in FIG. 4.

At or near the beginning of the transition to normal playback state, microcontroller core 18 may control clamping resistor 28 to transition in steps (as shown in FIG. 4) or continuously from the weak clamp state to the strong clamp state by decreasing an impedance of clamping resistor 28 during such transition. After clamping resistor 28 has reached its strong state (e.g., at a time labeled $t_7'$ in FIG. 4), microcontroller core 18 may generate control signals such that the output of amplifier 16 of audio IC 9 operates in an unclamped amplifier state, meaning that microcontroller core 18 may cause output switch 24 to be activated, thus coupling a first terminal of load 19 to the output of amplifier 16 and decoupling the first terminal of load 19 from the second terminal of load 19. Accordingly, given that analog input signal $V_{IN}$ remains forced to its maximum magnitude negative value, amplifier 16 may generate an output voltage $V_{OUT}$ of approximately zero, thus muting load 19. As a result, an amplifier state of amplifier 16 may be unclamped and muted and the clamp state of clamping switch 26 and clamping resistor 28 may be an off clamp state.

After unclamping and muting load the output of amplifier 16 during the transition to normal playback state, microcontroller core 18 may generate a digital audio input signal DIG_IN in order to cause analog input signal $V_{IN}$ to ramp to its zero value (e.g., ramp both input terminals of amplifier 16 to the non-zero common-mode voltage of analog input signal $V_{IN}$), thus maintaining muting of load 19.

At a later time (e.g., shown at time $t_8'$ in FIG. 4), personal audio device 1 may transition from the transition to normal playback state to the powered up playback state, unmuting load 19 and playing back actual audio in the signal path from digital audio input signal DIG_IN through output voltage \Tour, thus operating in steady state.

The controlling of the signal path, switches, and clamp strength as described above may reduce or eliminate audible audio artifacts from occurring during transitioning between low power and normal states of personal audio device 1. For example, by staging a state of DAC 14 to output its maximum magnitude negative voltage (e.g., $V_{IN}=-V_{DAC}$), audio IC 9 may minimize or eliminate audible audio artifacts associated with a level shift current that occurs in many ground-centered DACs. As another example, by staging the clamp state from strong to weak and vice versa (e.g., as shown and described with respect to FIG. 4), audio IC 9 may eliminate or minimize the occurrence of cross talk between electrical nodes within audio IC 9.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus comprising:
    a digital-to-analog converter configured to convert a digital audio input signal into a differential analog input signal with a substantially non-zero common-mode voltage;
    an amplifier configured to receive the differential analog input signal and generate at an amplifier output a ground-centered output signal from the differential analog input signal;
    a clamp configured to selectively couple and decouple the amplifier output to a ground voltage; and
    a controller configured to:
        control the clamp to selectively couple and decouple the amplifier output to a ground voltage responsive to transitions between power states of a device comprising the apparatus; and
        control the differential analog input signal generated by the digital-to-analog converter in order to minimize a level transition current through an output load coupled to the amplifier output during transitions between the power states.

2. The apparatus of claim 1, wherein the controller is further configured to control a clamping impedance of the clamp during transitions between the power states.

3. The apparatus of claim 1, wherein the transitions between power states comprise a transition between a powered off state and a powered on state and a transition between the powered on state and the powered off state.

4. The apparatus of claim 3, wherein the controller is further configured to, during at least one of the transition between the powered off state and the powered on state and the transition between the powered on state and the powered off state, control the digital-to-analog converter such that the differential analog input signal is forced to its minimum signal level in order to minimize the level transition current.

5. The apparatus of claim 3, wherein the controller is further configured to, during at least one of the transition between the powered off state and the powered on state and the transition between the powered on state and the powered off state, control the clamp to selectively couple the amplifier output to the ground voltage.

6. The apparatus of claim 1, wherein the transitions between power states comprise a transition between a low power state and a powered on state and a transition between the powered on state and the low power state.

7. The apparatus of claim 6, wherein the controller is further configured to, during at least one of the transition between the low power state and the powered on state and the transition between the powered on state and the low power state, control the digital-to-analog converter such that the differential analog input signal is forced to its minimum signal level in order to minimize the level transition current.

8. The apparatus of claim 6, wherein the controller is further configured to, during at least one of the transition between the low power state and the powered on state and the transition between the powered on state and the low power state, control the clamp to selectively couple the amplifier output to the ground voltage.

9. The apparatus of claim 6, wherein the controller is further configured to, during the transition between the powered on state and the low power state, decrease a clamping impedance of the clamp.

10. The apparatus of claim 6, wherein the controller is further configured to, during the transition between the low power state and the powered on state, increase a clamping impedance of the clamp.

11. A method comprising, in an apparatus comprising a digital-to-analog converter configured to convert a digital audio input signal into a differential analog input signal with a substantially non-zero common-mode voltage, an amplifier configured to receive the differential analog input signal and generate at an amplifier output a ground-centered output signal from the differential analog input signal, and a clamp configured to selectively couple and decouple the amplifier output to a ground voltage:
controlling the clamp to selectively couple and decouple the amplifier output to a ground voltage responsive to transitions between power states of a device comprising the apparatus; and
controlling the differential analog input signal generated by the digital-to-analog converter in order to minimize a level transition current through an output load coupled to the amplifier output during transitions between the power states.

12. The method of claim 11, further comprising controlling a clamping impedance of the clamp during transitions between the power states.

13. The method of claim 11, wherein the transitions between power states comprise a transition between a powered off state and a powered on state and a transition between the powered on state and the powered off state.

14. The method of claim 13, further comprising, during at least one of the transition between the powered off state and the powered on state and the transition between the powered on state and the powered off state, controlling the digital-to-analog converter such that the differential analog input signal is forced to its minimum signal level in order to minimize the level transition current.

15. The method of claim 13, further comprising, during at least one of the transition between the powered off state and the powered on state and the transition between the powered on state and the powered off state, controlling the clamp to selectively couple the amplifier output to the ground voltage.

16. The method of claim 11, wherein the transitions between power states comprise a transition between a low power state and a powered on state and a transition between the powered on state and the low power state.

17. The method of claim 16, further comprising, during at least one of the transition between the low power state and the powered on state and the transition between the powered on state and the low power state, controlling the digital-to-analog converter such that the differential analog input signal is forced to its minimum signal level in order to minimize the level transition current.

18. The method of claim 16, further comprising, during at least one of the transition between the low power state and the powered on state and the transition between the powered on state and the low power state, controlling the clamp to selectively couple the amplifier output to the ground voltage.

19. The method of claim 16, further comprising, during the transition between the powered on state and the low power state, decreasing a clamping impedance of the clamp.

20. The method of claim 16, further comprising, during the transition between the low power state and the powered on state, increasing a clamping impedance of the clamp.

* * * * *